(12) United States Patent
Barth, Jr.

(10) Patent No.: US 9,564,184 B2
(45) Date of Patent: Feb. 7, 2017

(54) SENSE AMPLIFIER FOR SINGLE-ENDED SENSING

(71) Applicant: Invecas, Inc., Santa Clara, CA (US)

(72) Inventor: John Edward Barth, Jr., Williston, VT (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 14/939,782

(22) Filed: Nov. 12, 2015

(65) Prior Publication Data

US 2016/0148689 A1    May 26, 2016

Related U.S. Application Data

(60) Provisional application No. 62/085,201, filed on Nov. 26, 2014.

(51) Int. Cl.
| | |
|---|---|
| *G11C 7/06* | (2006.01) |
| *G11C 7/08* | (2006.01) |
| *G11C 15/04* | (2006.01) |

(52) U.S. Cl.
CPC ............... *G11C 7/067* (2013.01); *G11C 7/08* (2013.01); *G11C 15/04* (2013.01)

(58) Field of Classification Search
CPC ............ G11C 7/067; G11C 7/08; G11C 15/04
USPC .............. 365/189.07, 196, 203, 63
See application file for complete search history.

(56) References Cited

U.S. PATENT DOCUMENTS

| | | | | | |
|---|---|---|---|---|---|
| 4,965,767 | A | * | 10/1990 | Kinoshita | G11C 15/043 365/182 |
| 5,130,945 | A | * | 7/1992 | Hamamoto | G11C 15/043 365/45 |
| 5,345,411 | A | * | 9/1994 | Yoneda | G11C 15/046 365/189.07 |
| 5,936,873 | A | * | 8/1999 | Kongetira | G11C 7/062 365/203 |
| 6,181,591 | B1 | * | 1/2001 | Miyatake | G11C 15/00 365/156 |
| 6,195,278 | B1 | * | 2/2001 | Calin | G11C 15/00 365/189.07 |
| 6,349,399 | B1 | * | 2/2002 | Manning | G11C 7/1072 714/739 |
| 6,426,657 | B1 | * | 7/2002 | Miyatake | G11C 7/065 327/55 |
| 6,442,054 | B1 | * | 8/2002 | Evans | G11C 7/062 365/203 |
| 6,707,693 | B1 | * | 3/2004 | Ichiriu | G11C 15/00 365/189.04 |
| 7,084,672 | B1 | * | 8/2006 | Meng | G11C 15/04 327/51 |

(Continued)

*Primary Examiner* — Viet Q Nguyen
(74) *Attorney, Agent, or Firm* — Venture Pacific Law, PC

(57) ABSTRACT

A single ended line sense amplifier having an input coupled to a single ended line having a near end and a far end device comprises a plurality of nFET stacks coupled between the near end of the single ended line and the far end of the single ended line, a single ended line comparator coupled to the near end of the single ended line configured to compare a voltage at the near end of the single ended line to provide a logic state output, and a charge transistor coupled to the single ended line at a point that is between the near end of the single ended line and the far end of the single ended line to shift occurrence of snap back from strong charging of the single ended line.

15 Claims, 4 Drawing Sheets

(56) References Cited

U.S. PATENT DOCUMENTS

| | | | | |
|---|---|---|---|---|
| 7,113,415 B1* | 9/2006 | Khanna | G11C 15/04 | 365/203 |
| 7,133,302 B1* | 11/2006 | Srinivasan | G11C 15/04 | 365/189.07 |
| 7,317,628 B1* | 1/2008 | Meng | G11C 7/067 | 365/107 |
| 7,362,602 B1* | 4/2008 | Meng | G11C 7/062 | 365/207 |
| 7,586,772 B2* | 9/2009 | Chai | G11C 15/04 | 365/189.07 |
| 7,800,930 B1* | 9/2010 | Deshpande | G11C 15/04 | 365/203 |
| 7,852,652 B1* | 12/2010 | Fabry | G11C 15/04 | 365/203 |
| 8,493,763 B1* | 7/2013 | Argyres | G11C 15/04 | 365/49.1 |
| 8,837,188 B1* | 9/2014 | Krishnamurthy | G11C 15/046 | 365/49.1 |
| 8,913,412 B1* | 12/2014 | Khanna | G11C 15/04 | 365/49.17 |
| 2001/0026464 A1* | 10/2001 | Hata | G11C 15/04 | 365/49.1 |
| 2007/0247885 A1* | 10/2007 | Watanabe | G11C 15/04 | 365/49.17 |
| 2012/0206951 A1* | 8/2012 | Rachamadugu | G11C 15/04 | 365/49.17 |
| 2015/0206586 A1* | 7/2015 | Chang | G11C 15/046 | 365/49.17 |

* cited by examiner

SENSE AMPLIFIER FOR SINGLE-ENDED SENSING

CROSS REFERENCE

This application claims priority from a provisional patent application entitled "TCAM Design Options" filed on Nov. 26, 2014 and having application No. 62/085,201. Said application is incorporated herein by reference.

FIELD OF INVENTION

The disclosure relates to a sense amplifier, and, more particularly, to a sense amplifier and methods thereof for single ended line sensing.

BACKGROUND

Content addressable memories ("CAMs") are commonly used in cache and other address translation systems of high speed computing systems. Ternary content addressable memories ("TCAMs") are ternary state CAM cells and are commonly used for parallel search in high performance computing systems. The unit of data stored in a TCAM bitcell is ternary, i.e., having three possible states: logic one, logic zero, and don't care state (referred to as an "X" state). To store these three states, TCAM bitcells include a pair of memory elements.

CAMs permit its memory cells to be referenced by their contents. Thus, CAMs have found use in lookup table implementations such as cache memory subsystems and are now rapidly finding use in networking system applications such as network address translation, and other applications such as pattern recognition and data compression. CAMs' most valuable feature is its ability to perform a fast search operation in which search data is compared with stored data. Typically, a searched data word is loaded onto search lines and compared with stored data words in the CAMs. The stored data words are compared bit-by-bit with the searched data word. During a search-and-compare operation, the CAMs perform a parallel search and generates match or mismatch signal associated with each stored data word, indicating whether the search word matches any of the stored data words.

FIG. 1 illustrates a prior art block diagram for TCAM unit cells connected to a match line sense amplifier. TCAM bitcells 10 that form a data entry can be connected along the same row and connected to a match line ML, word lines WLY and WLX, and search lines ST and SC. A match line sense amplifier 20 is connected to an end of the match line. Each of the TCAM bitcells 10 comprise two static random-access memory ("SRAM") cells (or dynamic random access memory ("DRAM") cells, depending on the implementation) and a compare circuit 12 (e.g., an XOR circuit) to compare the data within the respective TCAM bitcell with bits of the searched data word.

An indication of a match or mismatch is indicated on the match line. The compare circuits 12 of the TCAM cells 10 of a stored data word can have their respective outputs logically dotted together in a dot-XOR structure via the match line. If any of the compare circuits 12 are on (i.e., driving the match line to a low state to indicate a mismatch), a mismatch can be identified for that respective stored data word. If the match line goes to a high state, then the stored data word can be identified as a match and the location of that data entry is outputted.

FIG. 2 illustrates a prior art block diagram for compare circuits of TCAM bitcells connected to a match line sense amplifier. As indicated above, the compare circuits 12 of the TCAM data entry are connected together via the match line. Due to the large number of compare circuits 12, the match line can be highly capacitive. The match line is further coupled to a match line sense amplifier 20 at one end of the match line to charge the match line and to detect a voltage on the match line. Due to their inherent parallel structure and charging required for operation, the match line can consume large amounts of power. For this reason, TCAMs require relatively high power and large current pulses to operate the compare function circuitry (e.g., match and search line pulsing) and for match line sensing. In order to produce fast compare circuits, large amounts of power are consumed to quickly recharge the match line to its high state in preparation for another data match comparison. Because the match line is highly capacitive and the match line sense amplifier is high powered to quickly charge the match line, a phenomena known as snap back occurs.

FIG. 3A illustrates a prior art block diagram of an equivalent circuit for a match line sense amplifier 20. The match line sense amplifier 20 is coupled to match line 23 and includes a match line charger 21 controlled by signal CM_B, and a sense inverter 22. The equivalent circuit of match line 23 includes a plurality of nFET stacks 24 and a resistor between the nFET stacks 24 which represent an equivalent resistance of a section of the metal match line 23. Match line 23 is a single line with a match line far end, ML_FAR, and a match line near end, ML_NEAR. The ML_NEAR end is coupled to the input of match line sense amplifier 20. For ease of understanding and not to obscure the invention with detailed signals, match line charger 21 charges the match line 23 to a high state when signal charge match, CM_B goes to a low state, the signal CM_B denotes an active low. Stated differently, as signal CM_B become active, the match line 23 is charged until a voltage at the input of sense inverter 22 of the sense amplifier 20 becomes a high state and turns off the signal CM_B. The match line has a given length and there is a metal resistance associated with the length. As the match line charger 21 quickly charges the match line 23, voltage throughout the match line 23 cannot change instantaneously and there is noticeable delay before the voltage reaches a steady state throughout the length of the match line 23. For example, a voltage measurement at match line near end, ML_NEAR is different from a voltage measurement at match line far end, ML_FAR because metal resistance and capacitance of the match line 23 introduces an RC time constant delay as the match line is robustly charged.

FIG. 3B illustrates a voltage vs time graph showing a snap back phenomena of a prior art match line. Graph 32 represents the output of sense inverter 22. As the voltage on the match line is quickly charged at the match line near end, voltage at ML_NEAR of the match line as shown by graph 34 increases in excess of the match line trip voltage at which point the match line charger 21 is turned off. A snap back phenomenon occurs as the voltage shown by graph 34 falls back to the match line far end, ML_FAR of the match line as shown by dotted graph 36. The voltage at the far end of the match line ML_FAR lags behind the voltage at the near end due to capacitance and resistance of the match line. Given enough time, the voltage at the match line near end, ML_NEAR and the match line far end, ML_FAR of the match line will eventually merge. However, since the sense inverter 22 senses voltage at the match line near end, ML_NEAR, and the overshoot is at the match line near end, ML_NEAR, the overshoot can reach the trip point of the sense inverter 22 thereby stopping the charge to the match line. Problem arises when the difference from the snap back voltage causes the sense inverter 22 to trip prematurely. Referring to graph 34, the trip point of the sense inverter 22 is set at approximately 400 millivolts. Because of the snap back phenomenon, the sense inverter 22 can be tripped when the voltage from graph 34 reaches the highest point. As the match line charger 21 is turned off, the voltage at the ML_NEAR and the voltage at the ML_FAR charge equalize, which cause the voltage at the ML_NEAR to snap back. The snap back phenomenon can cause the match line sense amplifier 20 to begin charging again. The snap back phenomenon causes havoc to match line sense amplifiers for single ended line sensing. As devices become smaller and voltage margins become tighter, the snap back phenomenon becomes even more of a problem for circuit designers.

For the foregoing reasons, there is a need for new methods and apparatuses for a sense amplifier the overcome the problem associated with quickly charging a single match line for single ended line sensing.

SUMMARY OF INVENTION

Briefly, the disclosure relates to a single ended line sense amplifier for sensing a line of a semiconductor device coupled to a match line array having a plurality of series connected match lines including a near end match line and far end match line, comprising a match line comparator coupled to the near end match line configured to compare a voltage at a near end of the match line to provide a logic state output, and a charge transistor coupled to the match line array at a point in the match line array that is between the near end match line and the far end match line configured to charge the match line array and reduce snap back to the match line sense amplifier.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. Furthermore, the following content addressable memory ("CAM") examples disclosed in the present disclosure are meant to aid in the understanding of the present disclosure and are not meant to limit the present disclosure in anyway. It is understood that a person having ordinary skill in the art can use the present disclosure for a variety of memory systems and for other semiconductor devices and systems that require voltage sensing on a line. For instance, a sense amplifier of the present disclosure and related methodology can be used for CAMs, single ended bit line scheme for two-port SRAMs, single ended DRAMs, cross point switches, etc.

Figure 1:
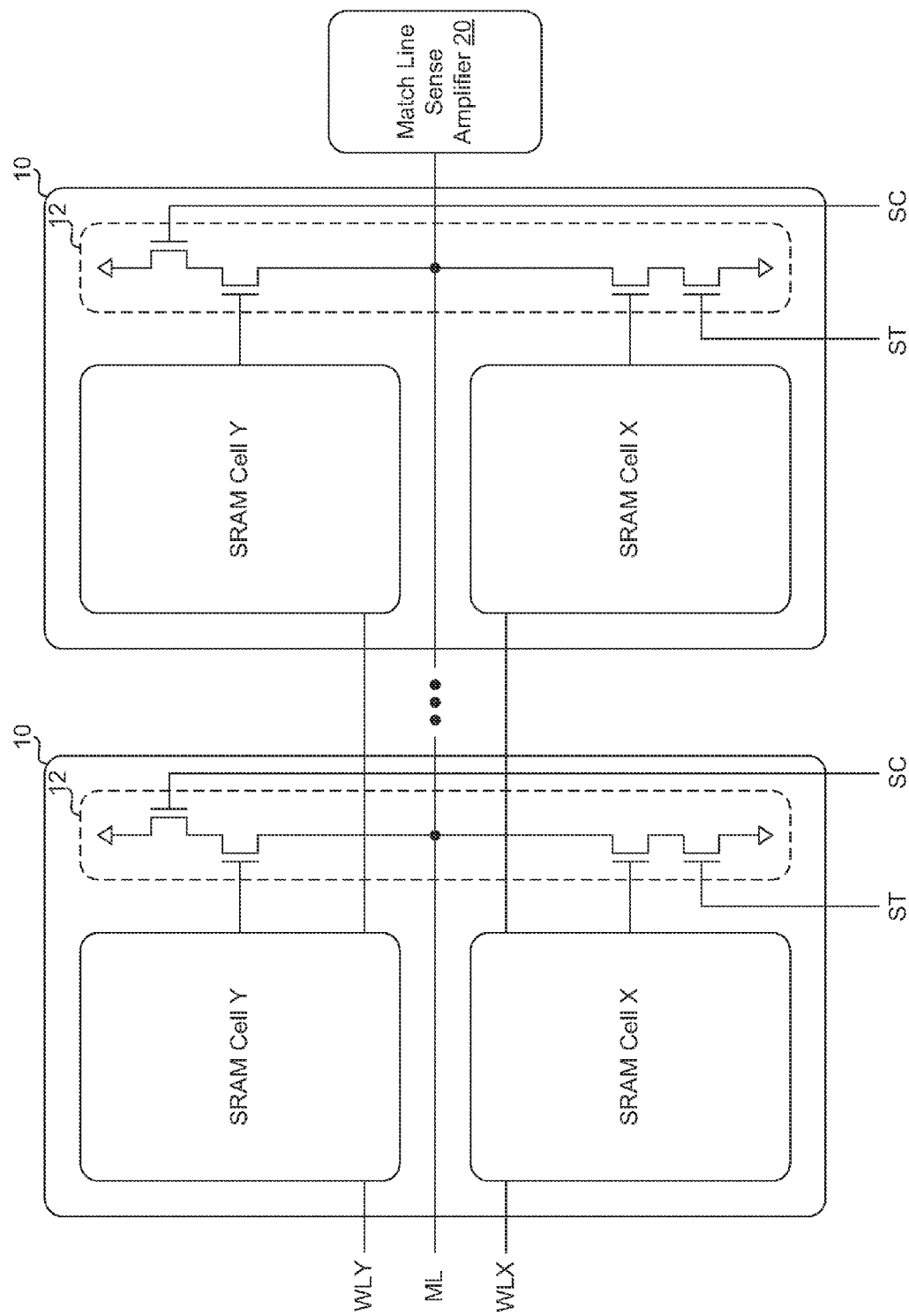
FIG. 1 illustrates a prior art block diagram for TCAM unit cells connected to a match line sense amplifier.
Figure 2:
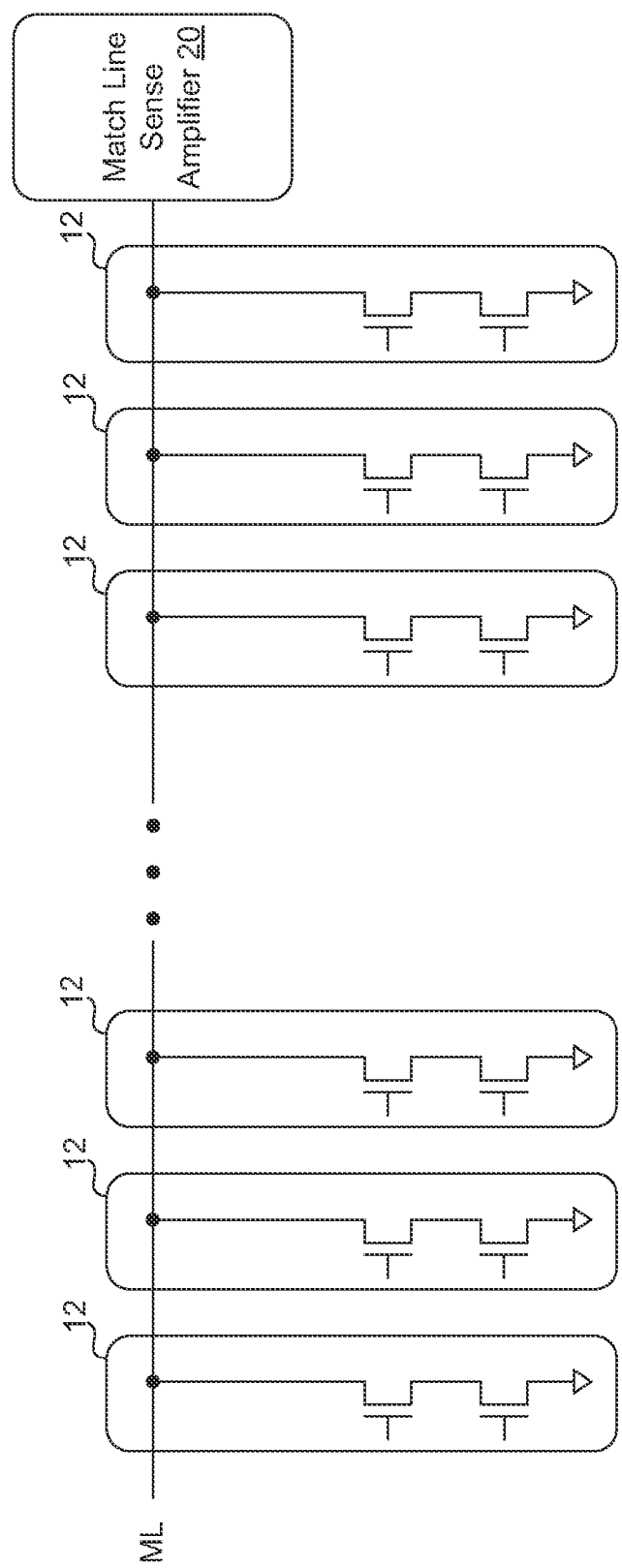
FIG. 2 illustrates a prior art block diagram for compare circuits of TCAMs connected to a match line sense amplifier.
Figure 3A:
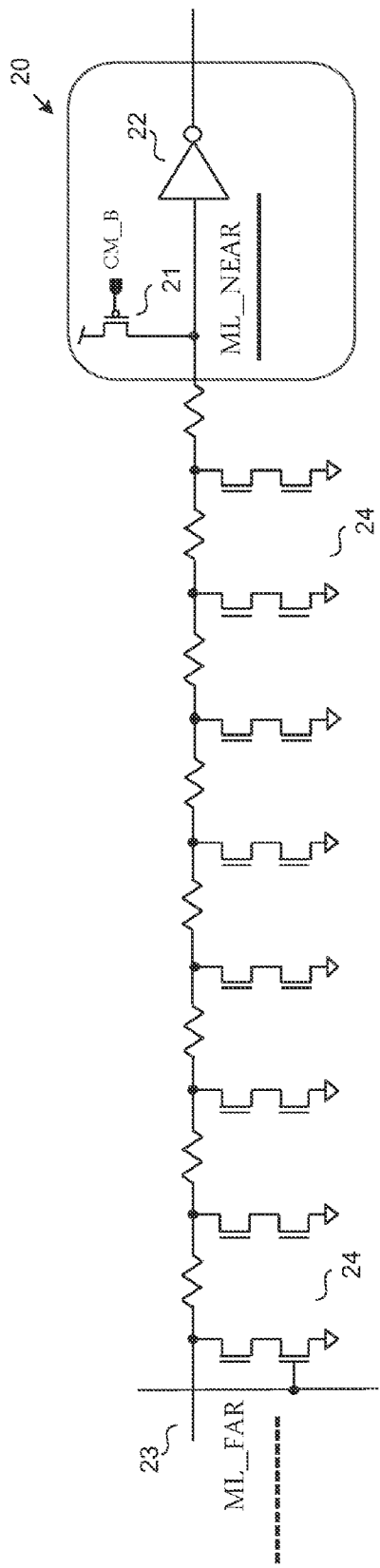
FIG. 3A illustrates a prior art block diagram of an equivalent circuit for a match line sense amplifier.
Figure 3B:
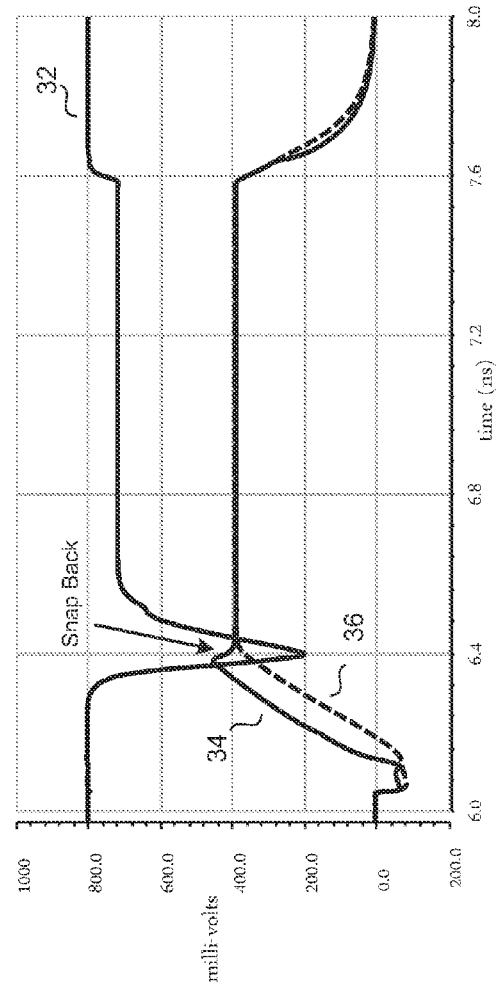
FIG. 3B illustrates a voltage vs time graph showing a snap back phenomena in a prior art match line charge circuit.
Figure 4A:
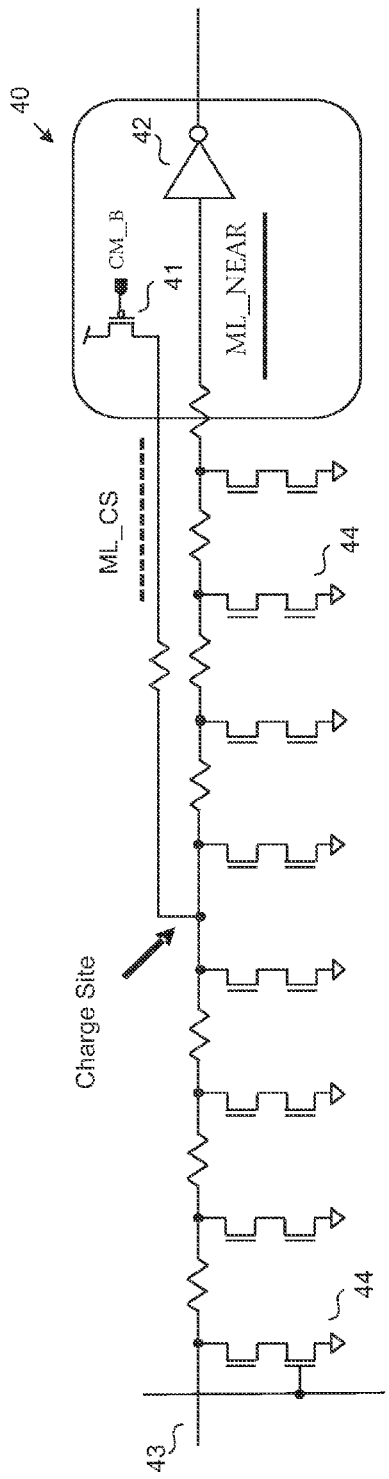
FIG. 4A illustrates a block diagram of an equivalent circuit of a match line sense amplifier in accordance with the present invention.

FIG. 4A illustrates a block diagram of an equivalent circuit for a match line sense amplifier 40 in accordance with the present invention. The match line charge circuit 40 is coupled to match line 43 and includes a match line charger 41 shown as a charge transistor. The equivalent circuit of match line 43 includes a plurality of nFET stacks 44 and an equivalent resistor between each of the components connected via the match line 43. The equivalent resistor represents an equivalent resistance for that respective section of the metal match line 43. The match line 43 can have a plurality of series interconnections between a plurality of nFET stacks. Match line charger 41 charges the match line 43 to a high state when signal charge match, CM_B goes to a low state, the signal CM_B denotes an active low. To restate, as signal CM_B become active, the match line 43 is charged until a voltage at the input of sense inverter 42 of the sense amplifier 40 becomes a high state and turns off the signal CM_B. The high state CM_B signal turns off the match line charger 41 to the match line 43. It is noted that for sake of brevity other intermediate circuits between the sense inverter 42 and CM_B has not been shown.

In accordance to an embodiment of the present invention, the snap back phenomena can be alleviated by shifting or moving a snap back phenomenon site to another section of the match line. Logically, the match line charger can be placed to charge the match line at a point further away from the sense inverter to reduce the snap back phenomenon. Although the sense inverter and the charge circuit can be separated in proximity from each other, however, such separation between the sense inverter and the charge circuit can cause timing delays that can adversely affect proper operation. Moreover, circuit design restraints prevent moving the match line charger away from the sense inverter 42 to another section of the match line. Accordingly, in an embodiment of the present invention, a metal line is added to direct the output of the match line charger to another point or section of the match line away from the near end or sense end that is directly coupled to the sense inverter 42. In such a configuration, the snap back phenomena occurs away from the near end of the match line where the sense inverter 42 makes the determination to turn off the charge circuit.

Figure 4B:
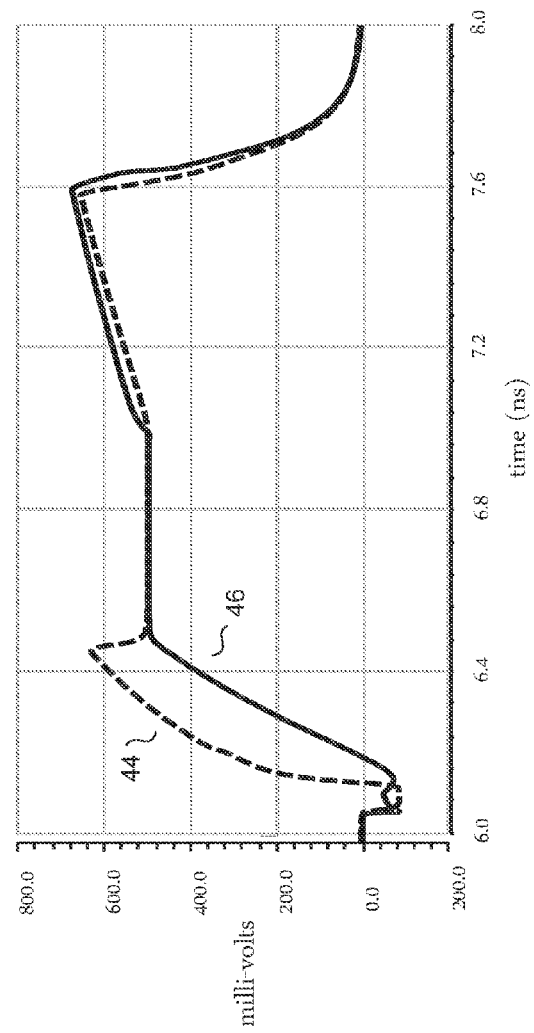
FIG. 4B illustrates a voltage vs time graph showing a shifted snap back phenomena in accordance with the present invention.

FIG. 4B illustrates a voltage vs time graph showing a shifted snap back phenomena in accordance in an embodiment of the present invention. Similar snap back occurs as dotted graph 44 illustrates an increase in voltage or overshoot that is experienced at the match line charge site, ML_CS. Graph 46 illustrates the voltage away from the charging site which follows the voltage at the match line charging site; except in this case, this slower following voltage is the voltage being sensed at the sense inverter 42. Accordingly, the snap back phenomena occurs away from the sense inverter 42. By shifting the snap back phenomenon away from the input of the sense inverter 42, the voltage lag associated with metal resistance and capacitance of the match line occurs at the sense inverter 42 as shown by graph 46. Unlike the prior art example, the sense inverter 42 does not experience a problem from the snap back phenomenon.

For simplicity and ease of understanding, the charging site can be placed near the midline of the match line. Those skilled in the art will understand that the charging site does not have to be near the midline of the match line as other charging sites along the match line are still within the spirit of the present invention. Moreover, although the discussion has focused on CAMs and TCAMs, the single ended line sensing of the present invention is applicable to other sense amplifiers and methods thereof for single ended line sensing including those used in SRAMs and other data storage devices for mitigating snap back phenomenon associated with single ended line sensing.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

I claim:

1. A single ended line sense amplifier, comprising:
    a line sense inverter coupled to a near end of a line configured to compare a voltage at the near end of the line; and
    a charge transistor that is proximate to the line sense inverter,
    wherein the charge transistor is coupled to the line via a metal trace, and
    wherein the metal trace is connected to a point on the line that is not proximate to the near end.

2. The single ended line sense amplifier of claim 1, wherein the charge transistor is coupled to an approximate midpoint between the near end of the line and a far end of the line.

3. The single ended line sense amplifier of claim 1, wherein a first distance from the point to the near end of the line is smaller than a second distance from the point to a far end of the line.

4. The single ended line sense amplifier of claim 1, wherein a first distance from the point to the near end of the line is greater than a second distance from the point to a far end of the line.

5. The single ended line sense amplifier of claim 1, wherein a plurality of cells is connected to the line to form a line array, and wherein the metal trace couples the charge transistor to the line array at a point in the line array that is between the near end of the line and a far end of the line.

6. The single ended line sense amplifier of claim 5, wherein the point in the line array that couples to the metal trace is not proximate to the charge transistor.

7. A single ended line sense amplifier having an input coupled to a single ended line, comprising:
    a plurality of nFET stacks coupled between a near end of the single ended line and a far end of the single ended line;
    a single ended line comparator coupled to the near end of the single ended line configured to compare a voltage at the near end of the single ended line to provide a logic state output; and
    a charge transistor coupled to the single ended line at a point that is between the near end of the single ended line and the far end of the single ended line to shift occurrence of snap back from strong charging of the single ended line,
    wherein the charge transistor is proximate to the single ended line comparator,
    wherein the near end of the single ended line is proximate to the charge transistor and the single ended line comparator,
    wherein a metal trace couples the charge transistor to the single ended line at a point in the single ended line that is between the near end of the single ended line and the far end of the single ended line, and
    wherein the point in the single ended line that couples to the metal trace is not proximate to the charge transistor.

8. The single ended line sense amplifier of claim 7, wherein the charge transistor is coupled to an approximate midpoint between the near end of the single ended line and the far end of the single ended line.

9. The single ended line sense amplifier of claim 7, wherein the charge transistor is coupled to an approximate point between the near end of the single ended line and the far end of the single ended line that is closer to the near end of the single ended line than the far end of the single ended line.

10. The single ended line sense amplifier of claim 7, wherein the charge transistor is coupled to an approximate point between the near end of the single ended line and the far end of the single ended line that is farther from to the near end of the single ended line than the far end of the single ended line.

11. The single ended line sense amplifier of claim 7 is used in a Content Addressable Memory.

12. A single ended line sense amplifier, comprising:
    a match line sense inverter coupled to a near end of a match line configured to compare a voltage at the near end of the match line, wherein a plurality of cells is connected to the match line to form a match line array; and
    a charge transistor coupled to the match line at a point in the match line array that is between the near end of the match line and a far end of the match line,
    wherein the charge transistor charges the match line array at the point,
    wherein the charge transistor is proximate to the match line sense inverter,
    wherein the near end of the match line is proximate to the charge transistor and the match line sense inverter,
    wherein a metal trace couples the charge transistor to the match line array at a point in the match line array that is between the near end of the match line and the far end of the match line, and
    wherein the point in the match line array that couples to the metal trace is not proximate to the charge transistor.

13. The single ended line sense amplifier of claim 12, wherein the charge transistor is coupled to an approximate midpoint between the near end of the match line and the far end of the match line.

14. The single ended line sense amplifier of claim 12, wherein a first distance from the point to the near end of the line is smaller than a second distance from the point to the far end of the line.

15. The single ended line sense amplifier of claim 12, wherein a first distance from the point to the near end of the line is greater than a second distance from the point to the far end of the line.

* * * * *